(12) United States Patent
Ligander

(10) Patent No.: US 8,253,028 B2
(45) Date of Patent: Aug. 28, 2012

(54) MICROWAVE CHIP SUPPORTING STRUCTURE

(75) Inventor: Per Ligander, Gothenburg (SE)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 608 days.

(21) Appl. No.: 12/298,468

(22) PCT Filed: Apr. 27, 2007

(86) PCT No.: PCT/EP2007/054145
§ 371 (c)(1),
(2), (4) Date: Oct. 24, 2008

(87) PCT Pub. No.: WO2007/125094
PCT Pub. Date: Nov. 8, 2007

(65) Prior Publication Data
US 2009/0154124 A1   Jun. 18, 2009

(30) Foreign Application Priority Data
Apr. 28, 2006   (WO) ............... PCT/EP 2006/003997

(51) Int. Cl.
*H05K 1/16* (2006.01)
(52) U.S. Cl. ........................ 174/260; 361/760

(58) Field of Classification Search .................. 174/255, 174/258, 256, 260; 361/764, 760; 29/830
See application file for complete search history.

(56) References Cited

U.S. PATENT DOCUMENTS

| 5,206,712 A * | 4/1993 | Kornrumpf et al. .......... 361/729 |
| 2001/0028072 A1* | 10/2001 | Aoki et al. .................. 257/254 |
| 2003/0150641 A1* | 8/2003 | Kinayman et al. ............ 174/255 |
| 2007/0026567 A1* | 2/2007 | Beer et al. .................. 438/106 |
| 2009/0272568 A1* | 11/2009 | Ligander ..................... 174/260 |

FOREIGN PATENT DOCUMENTS
WO    WO 97/34247 A    9/1997
* cited by examiner

*Primary Examiner* — Yuriy Semenenko

(57) ABSTRACT

The present invention relates to a microwave chip supporting structure comprising a first microwave laminate layer, with a first side and a second side, and an outer limit. At least one conductor is formed on said first side extending towards said outer limit. The microwave chip supporting structure further comprises a second microwave laminate layer, with a first side and a second side, the second side of the second laminate layer being fixed to at least a part of the first side of the first laminate layer. The first laminate layer and/or the second laminate layer comprises at least one recess arranged for receiving a microwave chip intended to be connected to said conductor. The second laminate layer extends outside the outer limit of the first laminate layer, said conductors continuing on the second side of the second laminate layer without contacting the first laminate layer.

15 Claims, 5 Drawing Sheets

Section A-A

Section B-B

MICROWAVE CHIP SUPPORTING STRUCTURE

TECHNICAL FIELD

The present invention relates to a microwave chip supporting structure comprising a first microwave laminate layer, with a first side and a second side, the first microwave laminate layer having an outer limit, where further at least one conductor is formed on the first side of the first laminate layer, said conductor extending towards the outer limit of the first laminate layer.

BACKGROUND

In microwave technology, it has become technically feasible to integrate circuits in commercial packages for volume manufacturing and sale. Previously it was necessary to design a layout and mount discrete components on that layout, where a matching procedure often was necessary afterwards in order to tune the circuit. These packaged integrated microwave circuits thus make microwave design easier and cheaper than before.

A number of such packages have been developed during the last years. A package normally comprises a circuit with etched components on a silicon substrate, constituting a microwave chip. A package normally further comprises a carrier, for example in the form of a microwave laminate, to which the chip is fixed. The chip comprises connecting points, which are connected to connecting points on the laminate by means of bonding, using very thin gold wires. The laminate communicates its connecting points via a plurality of connectors, accessible for a user. The laminate and its chip are normally provided with a protective covering, for example an epoxy resin, a plastic cover shell, or both.

One such type of package is the so-called BGA (Ball Grid Array) package, which is an encapsulated circuit with a more or less complete M×N array of connectors on its lower side, constituting a so-called footprint. The connectors are in the form of balls which stands out a certain distance from the package. A circuit board on which the package is to be mounted has a corresponding soldering pattern comprising corresponding soldering pads, matching the footprint—one pad for each ball-shaped connector on the package. An adhesive soldering paste is dispensed on each pad. The package is placed on the circuit board in such a way that the ball-shaped connectors contact the desired corresponding soldering pads. Then the circuit board is gently heated in such a way that the balls and the soldering paste melts, followed by cooling, where the pads and the connectors now are soldered together.

The solder joint more or less preserves its spherical shape, creating a stand-off between the package and the circuit board. This is, however, disadvantageous at higher frequencies, since this stand-off constitutes an inductance which is difficult to predict with sufficient accuracy.

Another type of package is called QFN (Quad Flat No lead) which is rectangular with connectors arranged at all four sides. The connectors do not extend out from the outline of the package, but extend at least partly along the lower side of the package. The chip is glued to a laminate, and its connecting points are connected to connecting points on the laminate by means of bonding, using very thin gold wires. The connecting points on the laminate are in turn connected to the connectors of the package by means of via holes that extend from the top of the laminate where its bond-connected connecting point is positioned, to the lower side of the laminate, where the connector is positioned.

This configuration is, however, disadvantageous since there are two inductances present for each connection; the bond wire and the via. The higher frequency, the more problematic do these inductances become for designing an accurate, repeatable construction.

One other type of package is called flip-chip, and comprises a chip of BGA type, but much more miniaturized. The chip is soldered as an ordinary BGA package to a laminate in order to constitute either a BGA package or a QFN package.

If it is a BGA package, there are problems with stand-off distances for the ball connectors at the chip as well as at the lower side of the laminate. There are also vias connecting between connecting points on the upper side of the laminate, and the ball connectors on the lower side of the laminate.

If it is a QFN package, there are problems with stand-off distances for the ball connectors at the chip and those vias connecting between connecting points on the upper side of the laminate, and the connectors on the lower side of the laminate.

As described in U.S. Pat. No. 6,011,692, which is considered as closest prior art, a chip is bonded to connectors at a supporting element into which the chip is fastened. The bottom of the chip rests on a conductive foil. The supporting element is lowered into a recess in a circuit board with a ground plane. In the recess, the dielectrica of the circuit board is completely removed, allowing the lowered supporting element to rest on the conducting foil constituting the ground plane of the circuit board. In this way, the ground of the chip is easily connected to the circuit board ground. The connectors of the supporting element are connected to conductors at the circuit board via conductors, soldered or glued in place.

Although the known device functions in a satisfactory manner, there are certain aspects which can be improved, for example:

A glue or solder has to be applied to the conductors on the supporting structure, and may interfere with the chip and/or bond wires.

The transmission lines are broken by solder or glue joints at two places after the bond wires When mounting the supporting structure with its chip, the circuit board has to be brought through two runs in a pick-n-place machine and solder dispenser.

The bond wires are unprotected if no lid is positioned over the supporting structure Should a lid be placed over the supporting structure, the lid will be in contact with the conductors

SUMMARY

It is an aim of the present invention to present a microwave chip supporting structure adapted for microwave frequencies, which microwave package overcomes the above disadvantages.

This aim is achieved by means of a microwave chip supporting structure as mentioned in the introduction, where furthermore the microwave chip supporting structure comprises a second microwave laminate layer, with a first side and a second side, the second laminate layer being fixed to the first laminate layer in such a way that the second side of the second laminate layer faces at least a part of the first side of the first laminate layer. The first laminate layer and/or the second laminate layer comprises at least one recess arranged for receiving a microwave chip intended to be connected to said conductor. The second laminate layer further extends outside the outer limit of the first laminate layer, said conductors continuing on the second side of the second laminate layer without contacting the first laminate layer.

Preferred embodiments are disclosed in the dependent claims.

Several advantages are achieved by means of the present invention, for example:
- no glue or solder has to be applied to the conductors on the supporting structure,
- the transmission lines are unbroken, and
- only one run in a pick-n-place machine and solder dispenser is necessary.

BRIEF DESCRIPTION OF THE DRAWINGS

The present invention will now be described more in detail with reference to the appended drawing, where.

DETAILED DESCRIPTION

Figure 1:
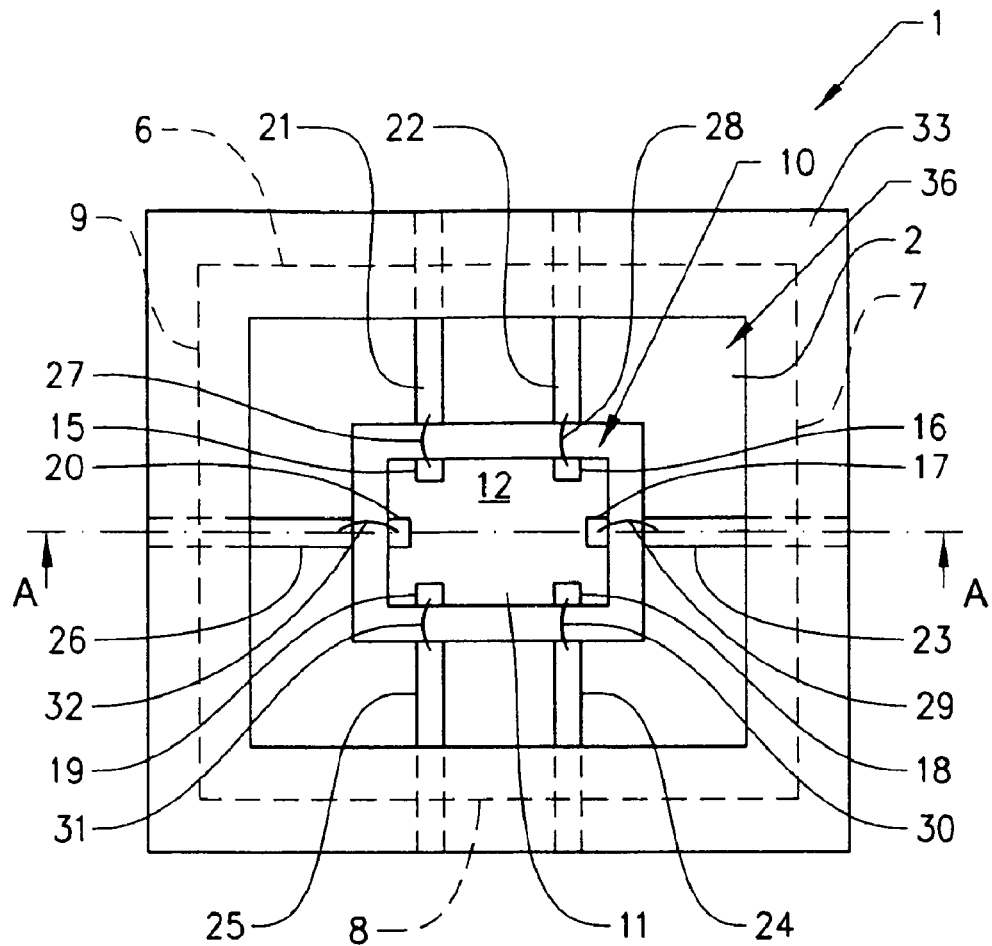
FIG. 1 shows a top view of a first embodiment of the present invention.
Figure 2:
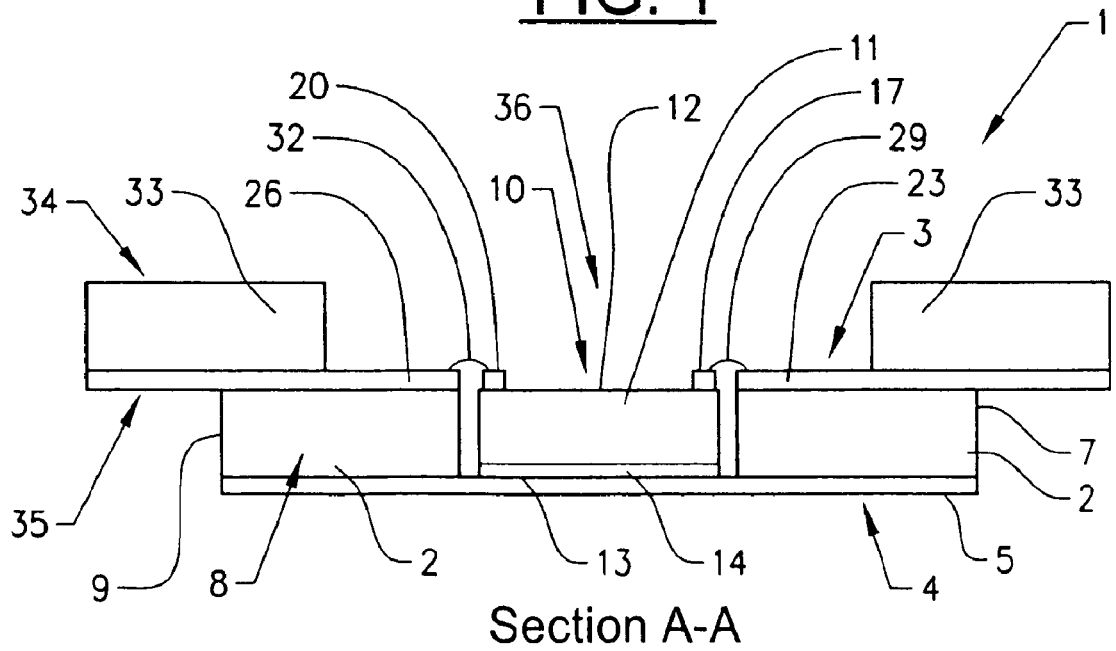
FIG. 2 shows a section of the first embodiment of the present invention.

In FIG. 1 and FIG. 2, illustrating a first embodiment, a microwave chip supporting structure 1 is shown. Said supporting structure 1 comprises a first microwave laminate layer 2, for example a PTFE-based laminate, with a first side 3 and a second side 4, where a copper ground plane 5 is fixed to the second side 4. The first laminate layer 2 is limited by a first edge 6, a second edge 7, a third edge 8 and a fourth edge 9, the first laminate layer 2 being essentially rectangular. A first recess 10 is formed in the first laminate layer 2, where the first recess 10 is formed in such a way that a part of the copper ground plane 5 is forming an accessible surface, against which a microwave chip 11 is fixed by means of, for example, soldering or gluing. Such a chip 11 is normally constituted by a circuit with etched components on a silicon substrate. The chip 11 has a top side 12 and a bottom side 13, the bottom side 13 facing the ground plane. In that way, the chip's ground may be directly connected to the ground plane 5, since the chip's bottom side 13 has at least one ground connection 14. The chip 11 and the microwave chip supporting structure 1 together form a microwave package.

The chip 11 has connections 15, 16, 17, 18, 19, 20 on its top side 12, which connections 15, 16, 17, 18, 19, 20 are brought into contact with conductors 21, 22, 23, 24, 25, 26 formed on the first side 3 of the first laminate layer 2 by means of corresponding bonding wires 27, 28, 29, 30, 31, 32. The conductors 21, 22, 23, 24, 25, 26 extend towards the four edges 6, 7, 8, 9 of the first laminate layer 2.

According to the present invention, the supporting structure 1 further comprises a second microwave laminate layer 33, for example a PTFE-based laminate, with a first side 34 and a second side 35. The second laminate layer 33 is fixed to the first laminate layer 2 in such a way that the second side 35 of the second laminate layer 33 faces the first side 3 of the first laminate layer 2. The conductors 21, 22, 23, 24, 25, 26 are thus positioned between the first laminate layer 2 and the second laminate layer 33. A second recess 36 is formed in the second laminate layer 33, having essentially the same position as the first recess 10, but being larger in order to allow the bond wires 27, 28, 29, 30, 31, 32 to be connected to the conductors 21, 22, 23, 24, 25, 26.

The second laminate layer 33 further extends outside the four edges 6, 7, 8, 9 of the first laminate 2, the conductors 21, 22, 23, 24, 25, 26 continuing out from the first laminate layer 2 and continuing on the second side 35 of the second laminate layer 33. The second laminate 33 layer thus carries the conductors 21, 22, 23, 24, 25, 26 out from the first laminate layer 2.

Figure 3:
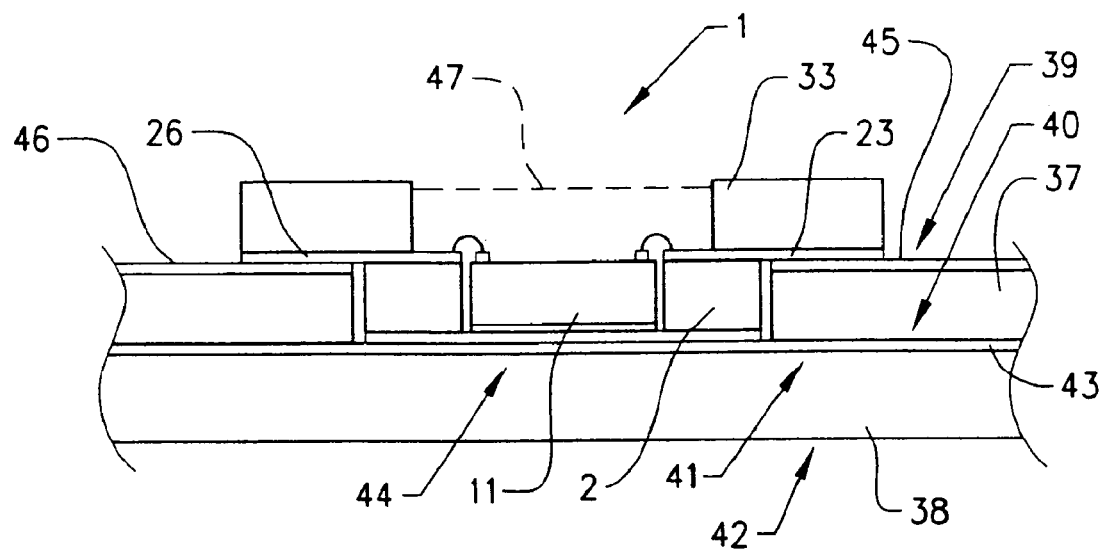
FIG. 3 shows a section of the first embodiment of the present invention.

As shown in FIG. 3, a first PCB (printed circuit board) 37 and a second PCB 38 is shown. The first PCB 37 has a first side 39 and a second side 40, and the second PCB 38 has a first side 41 and a second side 42. The first PCB 37 and the second PCB 38 are attached to each other in such a way that the second side 40 of the first PCB 37 and the first side 41 of the second PCB 41 face each other with a PCB ground plane 43 positioned between. In the first PCB 37, a third recess 44 is formed in such a way that a part of the PCB ground plane 43 is forming an accessible surface, against which the supporting structure 1 is fixed by means of, for example, soldering or gluing.

The first PCB 37 has a thickness that essentially is the same as the thickness of the first laminate layer 2, resulting in that the conductors 21, 22, 23, 24, 25, 26, when carried only by the second laminate 33, will rest on corresponding PCB conductors 45, 46. The connections between the conductors 21, 22, 23, 24, 25, 26 on the second laminate 33 and the PCB conductors 45, 46 are achieved by means of for example soldering or gluing.

In this way, each conducting path is only broken by one solder or glue joint after the respective bond wire 27, 28, 29, 30, 31, 32.

The chip 11 is now surrounded by the second laminate layer 33, which offers a protection for the chip 11. In order to achieve a more rigid protection of the chip, the second recess 36, formed in the second laminate layer 33, may be filled with a protective filler substance 47, such as for example epoxy. Other examples of the protective filler substance 47 are a gel or a silicone compound.

Figure 4:
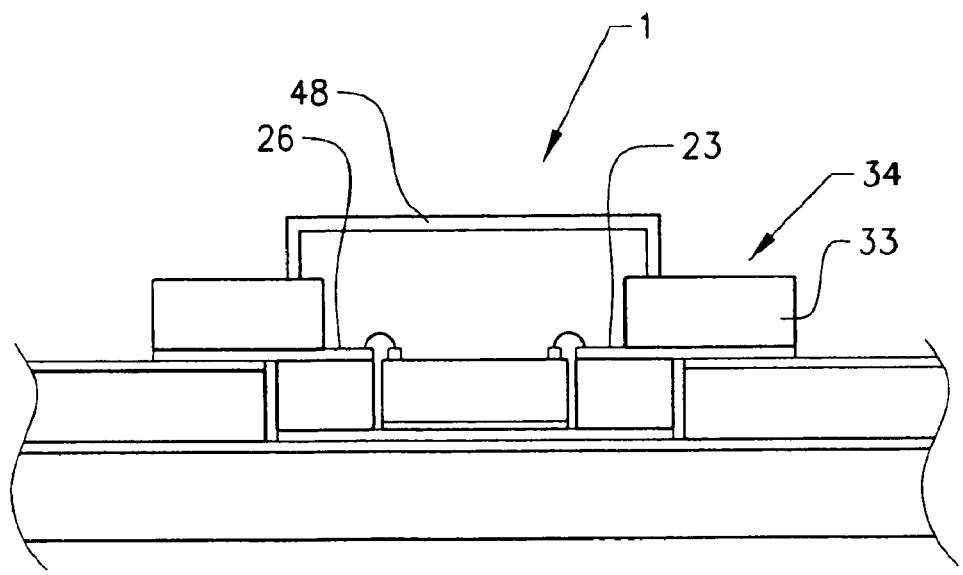
FIG. 4 shows a section of a variety of the first embodiment of the present invention.

According to a variety of the first embodiment, as shown in FIG. 4, a cover 48 is placed on the first side 34 of the second laminate layer 33, covering the chip 11 without interfering with any conductors 23, 26. The cover 48 may for example be made in plastic, metal or a combination of both. The cover 48 may of course be combined with a protective filler substance as disclosed with reference to FIG. 3. The shape of the cover 48 may vary, it may for example be arched or be constituted by a flat lid lying directly on the first side 34 of the second microwave laminate layer 33.

Figure 5:
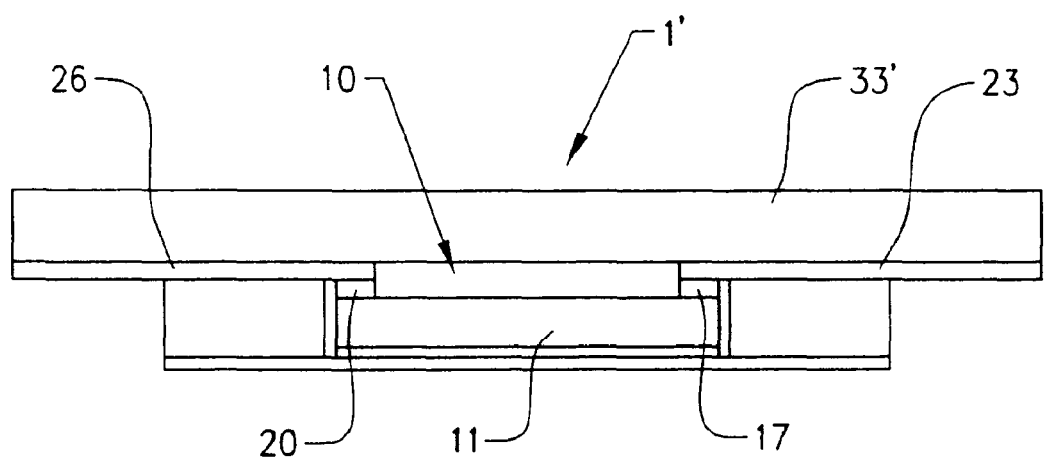
FIG. 5 shows a section of a second embodiment of the present invention.

According to a second embodiment of the present invention, with reference to FIG. 5, showing a microwave chip supporting structure 1', the second laminate layer 33' is not provided with a recess, but covers the chip 11. In this second embodiment, there are no bond wires, but the second laminate layer 33' carries the conductors 23, 26 partly into the first recess 10, enabling them to achieve a direct contact with the chip connections 17, 20, thus dispensing with the need for bond wires. In this way, the second laminate layer functions as:
   a first connecting means, between the chip connections and the conductors on the first side of the first laminate, a second connecting means, between the conductors on the first side of the first laminate and the PCB connections, and a cover for the chip.

The second embodiment corresponds to the first embodiment regarding all other features, and may of course be attached to a PCB in the same way as described for the first embodiment.

Figure 6:
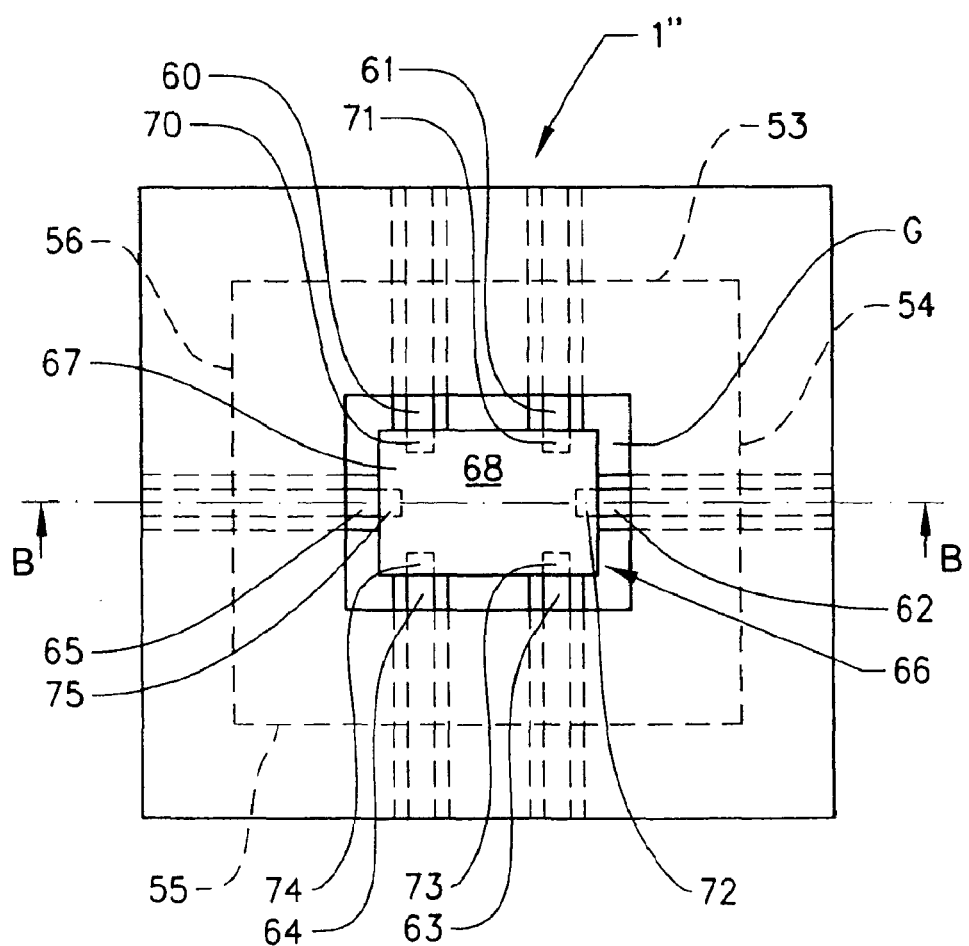
FIG. 6 shows a top view of a third embodiment of the present invention.
Figure 7:
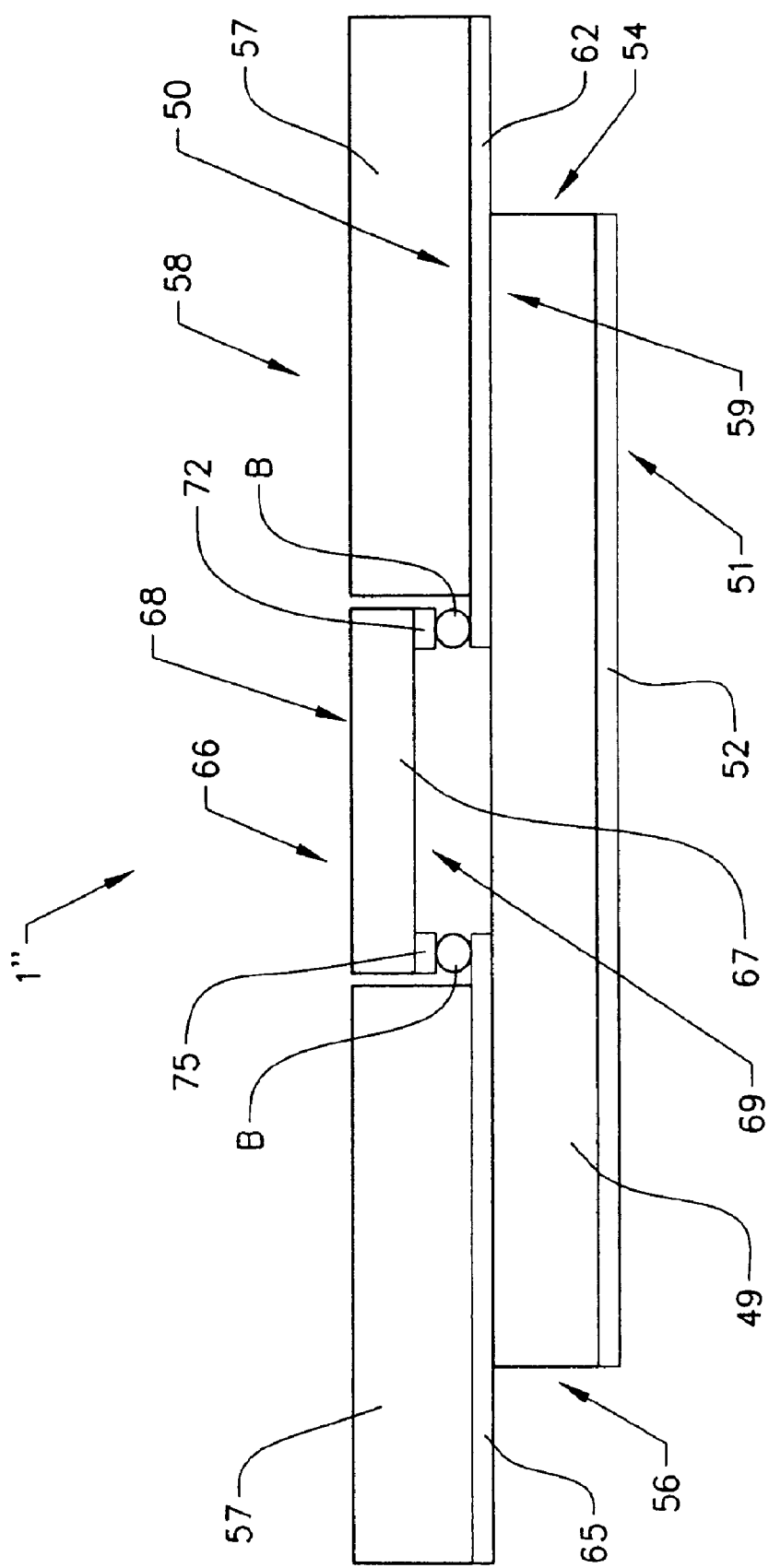
FIG. 7 shows a section of the third embodiment of the present invention.

In FIG. 6 and FIG. 7, illustrating a third embodiment, a microwave chip supporting structure 1" is shown. Said supporting structure 1" comprises a first microwave laminate layer 49, for example a PTFE-based laminate, with a first side 50 and a second side 51, where a copper ground plane 52 is fixed to the second side 51. The first laminate layer 49 is limited by a first edge 53, a second edge 54, a third edge 55 and a fourth edge 56, the first laminate layer 49 being essentially rectangular.

The supporting structure 1" further comprises a second microwave laminate layer 57, for example a PTFE-based laminate, with a first side 58 and a second side 59. The second laminate layer 57 is fixed to the first laminate layer 49 in such a way that the second side 59 of the second laminate layer 57 faces the first side 50 of the first laminate layer 49. Conductors 60, 61, 62, 63, 64, 65 are formed between the first laminate layer 49 and the second laminate layer 57 in a similar way as described for the previous embodiments. The conductors 60, 61, 62, 63, 64, 65 are of the type CPW (co-planar waveguide), i.e. the conductors are surrounded by their corresponding ground plane G, separated from the ground plane by a small gap, in a way well known to the person skilled in the art.

A recess 66 is formed in the second laminate layer 57, being of such a form that a microwave chip 67 fits in the recess 66, the chip 67 having a top side 68 and a bottom side 69. The chip 67 is arranged to rest on the first side 50 of the first laminate layer 49 in such a way that connections 70, 71, 72, 73, 74, 75 on the bottom side 69 of the chip 67 are brought into contact with the conductors 60, 61, 62, 63, 64, 65 formed on the first side 50 of the first laminate layer 49.

The connections between conductors 60, 61, 62, 63, 64, 65 and the chip connections 70, 71, 72, 73, 74, 75 are in the form of ball connectors B which stand out a certain distance from the package. An adhesive soldering paste is dispensed on an appropriate spot at each conductor 60, 61, 62, 63, 64, 65 before the chip 67 is fitted in place. Then the circuit board is gently heated in such a way that the balls B and the soldering paste melts, followed by cooling, where the conductors 60, 61, 62, 63, 64, 65 and the chip connections 70, 71, 72, 73, 74, 75 now are soldered together.

The second laminate layer 57 further extends outside the four edges 53, 54, 55, 56 of the first laminate 49, the conductors 60, 61, 62, 63, 64, 65 continuing out from the first laminate layer 49 and continuing on the second side 59 of the second laminate layer 57. The second laminate 57 layer thus carries the conductors 60, 61, 62, 63, 64, 65 out from the first laminate layer 49 in the same way as described for the previous embodiments.

The supporting structure 1" according to the third embodiment may thus be attached to a PCB in the same way as described for the previous embodiments. The copper ground plane 52 may be used for soldering the supporting structure 1" to the appropriate PCB, but is not necessary for any electric functions. If the supporting structure 1" is glued to the appropriate PCB instead, the copper ground plane 52 may be omitted.

The ball connectors B of the third embodiment may be exchanged with any type of convenient connection means, for example gluing with conducting glue, the main idea of the third embodiment is to present a supporting structure 1" to which it is possible to connect a chip 67 having both signal and ground connections on the same side of the chip 67, in this case the bottom side 69, allowing it to be connected to CPW conductors.

The recess 66 may be filled with a protective filler substance and/or covered with a protective cover as described for the first embodiment.

Figure 8:
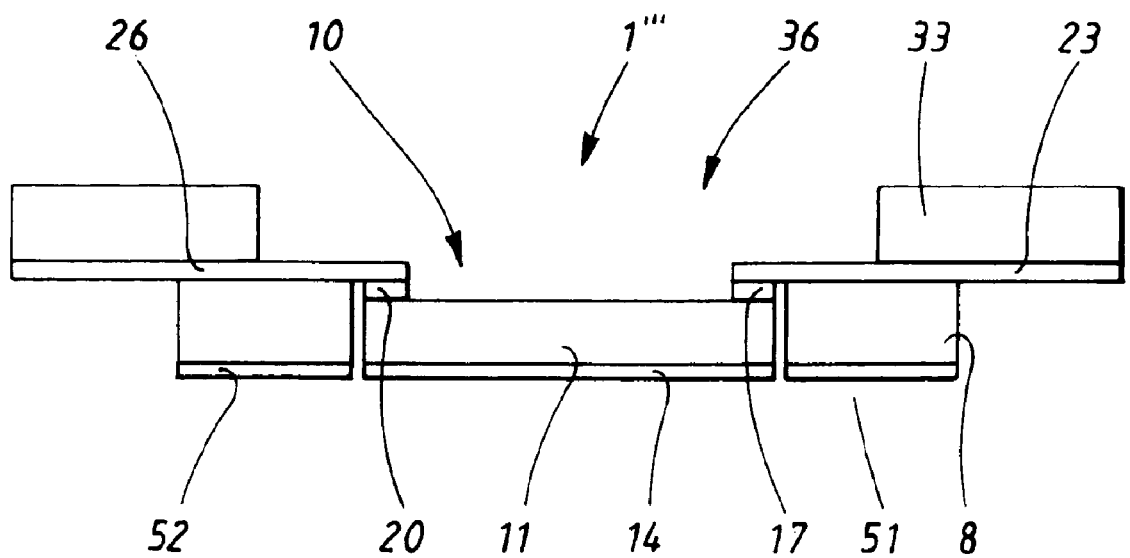
FIG. 8 shows a section of a fourth embodiment of the present invention.

In FIG. 8, a fourth embodiment of a microwave chip supporting structure 1''' is shown. This embodiment resembles the embodiment of FIG. 5, where there are no bond wires, but here the first laminate layer 8 carries the conductors 23, 26 partly into the first recess 10, enabling them to achieve a direct contact with the chip connections 17, 20, thus dispensing with the need for bond wires, since the second laminate layer 33 ends before the first recess 10, forming the second recess 36 in the same way as for the first embodiment. This means that the conductors 23, 26 partly are protruding over the first recess 10, not having any support of the first laminate layer 8.

The copper ground plane 52 is removed at the first recess 10, the first recess being accessible from the second side 51 of the first laminate layer 8. The chip 11 is preferably inserted from this side. This means that the chip's ground connection 14 is electrically separated from the copper ground plane 52 of the microwave chip supporting structure 1''' when not being mounted. The chip's ground connection 14 and the copper ground plane 52 are electrically connected when the microwave chip supporting structure 1''' is mounted on a PCB structure (not shown in FIG. 8) as described for the first embodiment. The chip's ground connection 14 and the copper ground plane 52 are then directly connected to the PCB ground plane 43 by means of, for example, soldering.

For the fourth embodiment, the second recess 36, formed in the second laminate layer 33, may be filled with a protective filler substance as described previously with reference to FIG. 3 (not shown in FIG. 8).

The invention is not limited to the embodiments described, but may vary freely within the scope of the appended claims. For example, the conductors 21, 22, 23, 24, 25, 26; 60, 61, 62, 63, 64, 65 on the first laminate layer 2; 49 extend towards at least one of the edges 6, 7, 8, 9; 53, 54, 55, 56 of the first laminate layer 2; 49. The second laminate layer 33, 33'; 57 extends a certain distance outside the at least one edge 6, 7, 8, 9; 53, 54, 55, 56 of the first laminate layer 2; 49, the conductors 21, 22, 23, 24, 25, 26; 60, 61, 62, 63, 64, 65 continuing out from the first laminate layer 2; 49 and continuing on the second side 35; 59 of the second laminate layer 33, 33'; 57. The second laminate layer 33, 33'; 57 preferably only extends outside those edges 6, 7, 8, 9; 53, 54, 55, 56 of the first laminate layer 2; 49 towards which the conductors 21, 22, 23, 24, 25, 26; 60, 61, 62, 63, 64, 65 of the first laminate layer 2; 49 extend.

The number of conductors on the first laminate layer 2; 49 is at least one.

The second laminate layer 33, 33'; 57 thus extends outside at least one edge 6, 7, 8, 9; 53, 54, 55, 56 of the first laminate layer 2; 49. The length of the extension, or extensions, should be appropriate to fulfill its connecting function.

The widths of the conductors should be adapted to achieve optimal performance, usually by adapting them to the characteristic impedance of the system. Such an adaptation must take into account whether the conductors run as microstrip, i.e. essentially on a supporting dielectric structure without any dielectrica on the other side, or as stripline, i.e. squeezed between two supporting structures. The same is valid if the conductors run in a CPW configuration.

The materials may also be chosen conveniently depending on performance and cost requirements, the materials mentioned herein are only mentioned as an example. The laminate layer may for example be formed using ceramics instead of PTFE. Furthermore, the copper ground planes may for example be formed in any suitable conducting material, for example gold.

The ground planes may furthermore be omitted if suitable, for example if other ground connections are available.

The shapes of the materials and the recesses may also vary in any way, the recess may be oval or circular, if that is more convenient due to manufacturing or chip structure. The edges 6, 7, 8, 9; 53, 54, 55, 56 may be arranged in any way, the function of the edges is to define an outer limit of the first laminate layer 2; 49.

The conductors on the PCB may be in the form of CPW for all embodiments.

What is claimed is:

1. A microwave chip supporting structure comprising:
    a first microwave laminate layer having a first side and a second side, the first microwave laminate layer having an outer limit where further at least one conductor is formed on the first side of the first laminate layer, said conductor extending towards the outer limit of the first laminate layer, wherein
    the first laminate layer has a first recess, into which a microwave chip is inserted, the microwave chip having a top side and a bottom side, the bottom side facing an electrically conducting ground plane that is fixed to the second side of the first laminate layer, and the top side being equipped with chip connections, which the chip connections are brought into contact with said conductor;
    a second microwave laminate layer with a first side and a second side, the second laminate layer being fixed to the first laminate layer in such a way that the second side of the second laminate layer faces at least a part of the first side of the first laminate layer;
    where the second laminate layer further extends outside the outer limit of the first laminate layer, said conductor continuing on the second side of the second laminate layer without contacting the first laminate layer.

2. The microwave chip supporting structure according to claim 1, characterized in that said bottom side has at least one ground connection which is electrically connected to said ground plane.

3. The microwave chip supporting structure according to claim 1 wherein the second laminate layer has a second recess, having essentially the same position as the first recess, but being larger, allowing the chip connections to be brought into contact with said conductor by means of bond wires.

4. The microwave chip supporting structure according to claim 3, wherein the second recess is filled with a protective filler substance.

5. The microwave chip supporting structure according to claim 3 wherein a cover is placed on the first side of the second laminate layer, covering the chip.

6. The microwave chip supporting structure according to claim 1, wherein the second laminate layer covers the microwave chip, carrying the conductors partly into the first recess, enabling them to achieve a direct contact with the chip connections.

7. The microwave chip supporting structure according to claim 1 wherein the first laminate layer carries the conductors partly into the first recess, enabling them to achieve a direct contact with the chip connections.

8. The microwave chip supporting structure according to claim 1, wherein the second laminate layer has a recess arranged to receive a microwave chip, the microwave chip having a top side and a bottom side, where the chip is arranged to rest on the first side of the first laminate layer in such a way that connections on the bottom side of the chip are brought into contact with the conductor formed on the first side of the first laminate layer.

9. The microwave chip supporting structure according to claim 8, wherein the connections between conductors and the chip connections are in the form of ball connectors.

10. The microwave chip supporting structure according to claim 8, wherein the recess is filled with a protective filler substance.

11. The microwave chip supporting structure according to claim 8, wherein a cover is placed on the first side of the second laminate layer covering the microwave chip.

12. The microwave chip supporting structure according to claim 1, arranged for being placed in a recess, formed in a first Printed Circuit Board (PCB), the first PCB being attached to a second PCB in such a way that a second side of the first PCB and a first side of the second PCB face each other with a PCB ground plane positioned between the second side of the first PCB and the first side of the second PCB.

13. The microwave chip supporting structure according to claim 12, wherein a part of the PCB ground plane is forming an accessible surface via the recess, against which the supporting structure may be fixed.

14. The microwave chip supporting structure according to claim 12, wherein the first PCB has a thickness that essentially is the same as the thickness of the first laminate layer, resulting in that said conductor, when carried only by the second laminate layer, will rest on corresponding PCB conductors on the first PCB, enabling an electrical connection between said conductor on the second laminate and the PCB conductors.

15. The microwave chip supporting structure according to claim 12, wherein the PCB conductors are in the form of a Co-Planar Waveguide.

* * * * *